United States Patent
Pi et al.

(10) Patent No.: US 6,667,635 B1
(45) Date of Patent: Dec. 23, 2003

(54) FPGA LOOKUP TABLE WITH TRANSMISSION GATE STRUCTURE FOR RELIABLE LOW-VOLTAGE OPERATION

(75) Inventors: Tao Pi, Santa Clara, CA (US); Patrick J. Crotty, San Jose, CA (US)

(73) Assignee: Xilinx, Inc., San Jose, CA (US)

(*) Notice: Subject to any disclaimer, the term of this patent is extended or adjusted under 35 U.S.C. 154(b) by 0 days.

(21) Appl. No.: 10/241,094

(22) Filed: Sep. 10, 2002

(51) Int. Cl.[7] ............................................. H03L 19/173
(52) U.S. Cl. ............................................ 326/40; 326/38
(58) Field of Search ................................... 326/37–41

(56) References Cited

U.S. PATENT DOCUMENTS 6,373,279 B1   4/2002   Bauer et al.

OTHER PUBLICATIONS

Xilinx, Inc.; "Virtex–II Platform FPGA Handbook"; published Dec. 2000, available from Xilinx, Inc,, 2100 Logic Drive, San Jose, California 95124; pp. 33–75.

*Primary Examiner*—Don Le
(74) *Attorney, Agent, or Firm*—Lois D. Cartier

(57) ABSTRACT

A lookup table (LUT) for a field programmable gate array (FPGA) is designed to operate reliably at low voltage levels. The low-voltage LUT uses CMOS pass gates instead of unpaired N-channel transistors to select one memory cell output as the LUT output signal. Therefore, no voltage drop occurs across the pass gates. While this modification significantly increases the overall gate count of the LUT, this disadvantage can be mitigated by removing the half-latches required in current designs, and by removing initialization circuitry made unnecessary by the modification. Some embodiments include a decoder that decreases the number of pass gates between the memory cells and the output terminal, at the cost of an increased delay on the input paths that traverse the decoder.

20 Claims, 4 Drawing Sheets

US 6,667,635 B1

FPGA LOOKUP TABLE WITH TRANSMISSION GATE STRUCTURE FOR RELIABLE LOW-VOLTAGE OPERATION

FIELD OF THE INVENTION

The invention relates to Field Programmable Gate Arrays (FPGAs). More particularly, the invention relates to a lookup table for an FPGA that is designed for reliable low-voltage operation.

BACKGROUND OF THE INVENTION

Programmable logic devices (PLDs) are a well-known type of digital integrated circuit that can be programmed to perform specified logic functions. One type of PLD, the field programmable gate array (FPGA), typically includes an array of configurable logic blocks (CLBs) surrounded by a ring of programmable input/output blocks (IOBs). The CLBs and IOBs are interconnected by a programmable interconnect structure. Some FPGAs also include additional logic blocks with special purposes (e.g., DLLS, RAM, and so forth).

The CLBs, IOBs, interconnect, and other logic blocks are typically programmed by loading a stream of configuration data (bitstream) into internal configuration memory cells that define how the CLBs, IOBs, and interconnect are configured. The configuration data can be read from memory (e.g., an external PROM) or written into the FPGA by an external device. The collective states of the individual memory cells then determine the function of the FPGA.

A CLB typically includes at least two types of sub-circuits, with supporting logic. One sub-circuit type is the register element, which can be, for example, a flip-flop configurably programmable as a latch. The other common sub-circuit is a function generator, often a 4-input function generator that can provide any function of up to four input signals. The function generator is typically implemented as a lookup table (LUT), often a static RAM (SRAM).

For example, a 4-input LUT is typically implemented using a 16×1 SRAM. The SRAM is programmed (written to) during the configuration of the FPGA, using values included in the configuration bitstream. There are 16 possible combinations of the four input signals, so each of the 16 memory locations in the lookup table is programmed with the correct output value for the corresponding four input values. The four input values provide the four address bits for the 16×1 SRAM.

One FPGA, the Xilinx Virtex®-II FPGA, is described in detail in pages 33–75 of the "Virtex-II Platform FPGA Handbook", published December, 2000, available from Xilinx, Inc., 2100 Logic Drive, San Jose, Calif. 95124, which pages are incorporated herein by reference. FIG. 1 is a simplified block diagram of a Virtex-II CLB.

CLB 100 includes four "slices" SLICE_0–3, each slice including the logic shown in FIG. 1 for SLICE_0. (Other logic in the slice not relevant to the present application is omitted from FIG. 1, for clarity.) Each slice includes two LUTs 101–102. Each LUT can be programmed to function as any of a 4-input lookup table, a 16-bit shift register, and 16 bits of random access memory (RAM) in any of several configurations. When the LUTs are configured to function as RAM, a write strobe generator circuit 105 is active, and controls the write functions of the RAM. Each LUT 101–102 has two output signals OUT1 and OUT2. (In the present specification, the same reference characters are used to refer to terminals, signal lines, and their corresponding signals.) Both output signals OUT1–OUT2 have the same value; the output value is provided in duplicate merely to speed up the output path for each output signal.

Multiplexer MUX1 passes either the first output OUT1 of function generator 101 or an independent input signal Reg_DI_1 to 1-bit register 103. Register 103 can be configured as either a flip-flop or a latch. The outputs of LUT 101 and register 103 are both optionally provided as outputs of the slice (labeled D1 and Q1, respectively, in FIG. 1). Thus, the LUT and register can be used independently of each other or can be coupled together so the register stores the LUT output signal.

The second LUT output, OUT2, is optionally used to control the carry logic within the half-slice. LUT output signal OUT2 is coupled to the select terminal of carry multiplexer CM1, and selects one of the previous carry-out signal and a new input signal to place on the carry out terminal COUT.

The elements in the other half of the slice, including LUT 102, multiplexer MUX2, carry multiplexer CM2, and 1-bit register 104, are coupled together in a similar manner.

FIG. 2 shows the internal structure of the LUT included in the Virtex-II FPGA, i.e., LUTs 101 and 102 of FIG. 1. Again, extraneous logic is omitted from the drawing, for clarity. For example, the configuration logic used to load initial values into RAM cells RB201–RB216 is not shown. This logic and other omitted circuitry is well known in the art of FPGA design.

The Virtex-II LUT (101a in FIG. 2) includes 16 memory cells RB201–RB216. These memory cells are used to store the 16 possible output values for the four input signals IN1–IN4. Memory cells RB201–RB216 are accessed via several control and data signals. For example, signals CTRL/DATA1 access each memory cell, and include configuration control signals, write control signals (such as write strobe signal WS shown in FIG. 1), a direct data input signal (e.g., signals RAM_DI_1, RAM_DI_2 in FIG. 1), an initialization control signal, and so forth. Signals CTRL/DATA2 pass serially through each memory cell, and include configuration input data, a serial line used when the LUT is configured as a serial register, and so forth.

Each memory cell RB201–RB216 provides one output signal, of which one must be selected. The 16 output signals are reduced to four, first by eliminating half of the signals using input signal IN1, then by eliminating another half of the signals using input signal IN2. For example, the output of memory cell RB201 passes through N-channel transistor 211 whenever signal IN1 is high, while the output of memory cell RB202 passes through N-channel transistor 212 whenever input signal IN1 is low (i.e., the output of inverter INV1 is high). The selected one of these two output signals passes through N-channel transistor 231 whenever signal IN2 is high.

Similarly, the output of memory cell RB203 passes through N-channel transistor 213 whenever signal IN1 is high, while the output of memory cell RB204 passes through N-channel transistor 214 whenever input signal IN1 is low (i.e., the output of inverter INV1 is high). The selected one of these two output signals passes through N-channel transistor 232 whenever signal IN2 is low (i.e., the output of inverter INV2 is high). Thus, the output of one of memory cells RB201–RB204 is passed to node A, based on the values of signals IN1 and IN2.

Similarly, the output of one of memory cells RB205–RB208 is passed to node B, the output of one of memory cells RB209–RB212 is passed to node C, and the output of one of memory cells RB213–RB216 is passed to node D, also based on the values of signals IN1 and IN2.

Coupled to each of nodes A–D is a pull-up (241–244, respectively) implemented as a P-channel transistor coupled between the node and power high VDD. The pull-up is controlled by power-on reset signal PORB. During a power-on or reset sequence signal PORB is low, forcing each of nodes A–D to a high value and ensuring thereby that the LUT output signals OUT1–OUT2 are high after a power-on or reset sequence.

Node A then passes through a half-latch 245 to node E. Half-latch 245 includes an inverter 251 that buffers (and inverts) the signal on node A. However, a limitation of the circuit of FIG. 2 now comes into play. This limitation is inherent in the properties of N-channel transistors, i.e., that a high voltage level passing through an N-channel transistor is reduced by one threshold voltage of the transistor. Therefore, to ensure that node A reaches a true "high" level (i.e., reaches power high VDD when the node is high), a second pull-up 261 is included, forming half-latch 245. When node A is high, inverter 251 drives a low value, which turns on pull-up (P-channel transistor) 261. Thus, node A is pulled all the way to VDD, ensuring a reliable value on node A and hence on node E.

Similarly, half-latch 246 is provided between nodes B and F, half-latch 247 is provided between nodes C and G, and half-latch 248 is provided between nodes D and H.

The 16 outputs from memory cells RB201–RB216 have now been reduced to four signals on nodes E–H. Signal IN3 is now used to select one of signals E and F and pass the selected signal to node J, and to select one of signals G and H and pass the selected signal to node K.

Each of two logically identical output circuits now selects one of the two nodes J and K based on the value of signal IN4, and passes the selected signal to a half-latch and thence to the corresponding LUT output terminal. As described above in relation to FIG. 1, the LUT has two logically identical output signals OUT1 and OUT2, a configuration that enhances the performance of the CLB.

The first output circuit includes N-channel transistors 281, 283 and half-latch 291, and provides output signal OUT1 to the direct output D1 and multiplexer MUX1 of the CLB in FIG. 1. When signal IN4 is high, the signal on node J is passed through transistor 281 to node L and hence to half-latch 291 and output node OUT1. When signal IN4 is low (i.e., the output of inverter INV4 is high), the signal on node K is passed through transistor 283 to node L and hence to half-latch 291 and output node OUT1.

Similarly, the second output circuit includes N-channel transistors 282, 284 and half-latch 292, and provides output signal OUT2 to carry multiplexer CM1 of the CLB in FIG. 1. When signal IN4 is high, the signal on node J is passed through transistor 282 to node M and hence to half-latch 292 and output node OUT2. When signal IN4 is low (i.e., the output of inverter INV4 is high), the signal on node K is passed through transistor 284 to node M and hence to half-latch 292 and output node OUT2.

Note that half-latches are again required on the output signals to ensure reliable values on the output terminals OUT1 and OUT2.

By passing the memory cell output signals through a series of N-channel transistors and half-latches, a reliable circuit is provided that has the advantage of being relatively small. In other words, it uses a small number of transistors for the function performed, and it uses largely N-channel transistors, which are smaller than P-channel transistors designed to operate under the same conditions. Traditionally, small size is an important goal when designing memory arrays such as LUTs, and particularly so in FPGAs where hundreds or even thousands of copies of the LUT can be included in each device.

The LUT structure of FIG. 2 works well at present operating voltage levels, e.g., at 1.5 volts. However, FPGA operating voltages are consistently being reduced. A lower operating voltage offers the advantage of reduced power consumption. Further, lower operating voltages are required for the shorter gate length fabrication processes now being developed. Therefore, circuits in FPGAs being designed today will operate at even lower voltage levels, e.g., 1.2 volts.

As described above in relation to FIG. 2, a high voltage level passing through an N-channel transistor is reduced by one threshold voltage of the transistor (Vth). When the power high voltage level VDD is much greater than Vth, this limitation can be easily overcome, e.g., by the use of half-latches as in the LUT of FIG. 2. However, as VDD drops closer to Vth, this type of corrective measure is no longer adequate.

Therefore, it is desirable to provide a LUT structure for an FPGA that can reliably perform at an operating voltage closer to the threshold voltage level of an N-channel transistor than is possible with known LUT structures.

SUMMARY OF THE INVENTION

The invention provides a lookup table (LUT) for a field programmable gate array (FPGA) that is designed to operate reliably at low voltage levels. A LUT designed according to the invention includes no unpaired N-channel pass gates. Instead, CMOS pass gates are used, which include paired N- and P-channel transistors. Unlike an N-channel transistor, a CMOS pass gate can pass either a high signal or a low signal with no degradation in the voltage level of the input signal.

The described implementation is counter-intuitive, because of the significant increase in gate count compared to existing lookup tables. However, this disadvantage is mitigated in some embodiments by removing the half-latches required in current designs. In some embodiments, the circuit is also reduced in size by removing initialization circuitry that is rendered unnecessary by the removal of the N-channel pass gates.

According to one embodiment, the invention provides a LUT in an FPGA configurable with a configuration bitstream. The LUT includes N LUT input terminals, where N is an integer; N inverters coupled to the LUT input terminals; a LUT output terminal; a plurality of memory cells storing values from the configuration bitstream; and a plurality of CMOS pass gates coupled between the output terminals of each memory cell and the LUT output terminal. A path between each memory cell and the LUT output terminal traverses N of the CMOS pass gates. Each CMOS pass gate on a given path has a first gate terminal coupled to a different one of the LUT input terminals and a second gate terminal coupled to the output terminal of the associated inverter.

In some embodiments, the first gate terminal of each CMOS pass gate is an N-terminal and the second gate terminal is a P-terminal. In some embodiments, N is four, and some embodiments include 16 memory cells. Some embodiments include one or two inverters coupled to the LUT output terminal.

Some embodiments include an additional CMOS pass gate on each path between a memory cell and the LUT output terminal, M additional LUT input terminals, where M is an integer, and a decoder circuit. The decoder circuit has input terminals coupled to the M additional LUT input terminals and output terminals coupled to the gate terminals of the additional CMOS pass gates. The decoder circuit decodes the M input signals, then provides decoded output signals that can efficiently be used to select a LUT output signal. In one embodiment where N is two, M is also two. One such embodiment includes 16 memory cells.

The presence of the decoder circuit reduces the number of CMOS pass gates on the path through the LUT, at the cost of an increased delay on the LUT data input signals provided to the decoder. The increased delay on these input paths can be mitigated if the FPGA implementation software is designed to assign less speed-critical signals to the slower data input terminals.

Another embodiment of the invention is directed to a configurable logic block (CLB) in an FPGA, the CLB including at least one LUT substantially as described above.

BRIEF DESCRIPTION OF THE DRAWINGS

The present invention is illustrated by way of example, and not by way of limitation, in the following figures, in which like reference numerals refer to similar elements.

DETAILED DESCRIPTION OF THE DRAWINGS

In the following description, numerous specific details are set forth to provide a more thorough understanding of the present invention. However, it will be apparent to one skilled in the art that the present invention can be practiced without these specific details. For example, the examples provided show 4-input lookup tables (LUTs); however, the principles of the invention can also be applied to LUTs of other sizes. As another example, while the LUTs of the present invention are designed to operate reliably at low voltage levels, they can also be used at standard voltage levels or higher voltage levels. Therefore, the scope of the present invention is not limited by the design considerations that originally motivated the invention.

Figure 1:
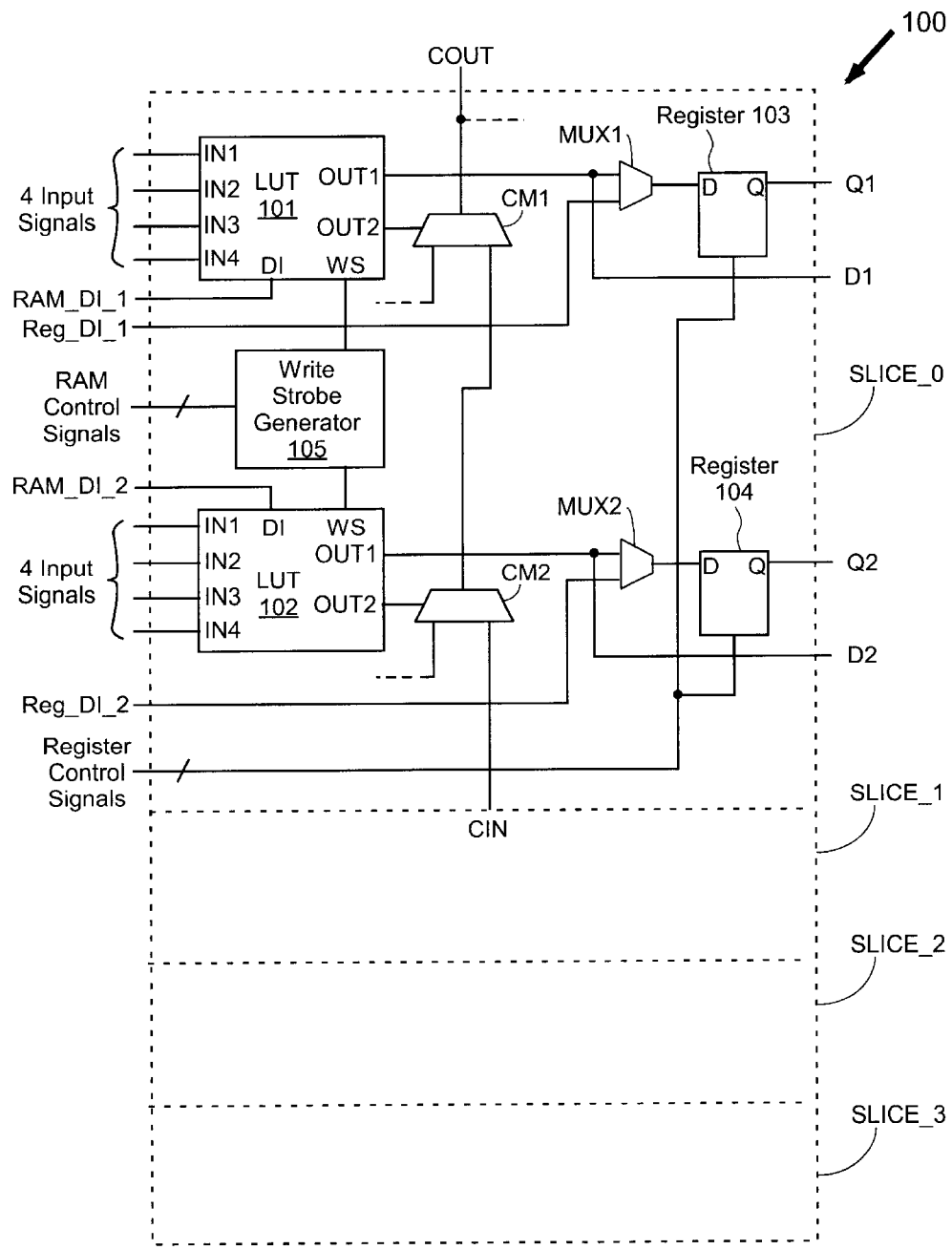
FIG. 1 is a block diagram of a configurable logic block (CLB) from a Xilinx Virtex-II FPGA.
Figure 3:
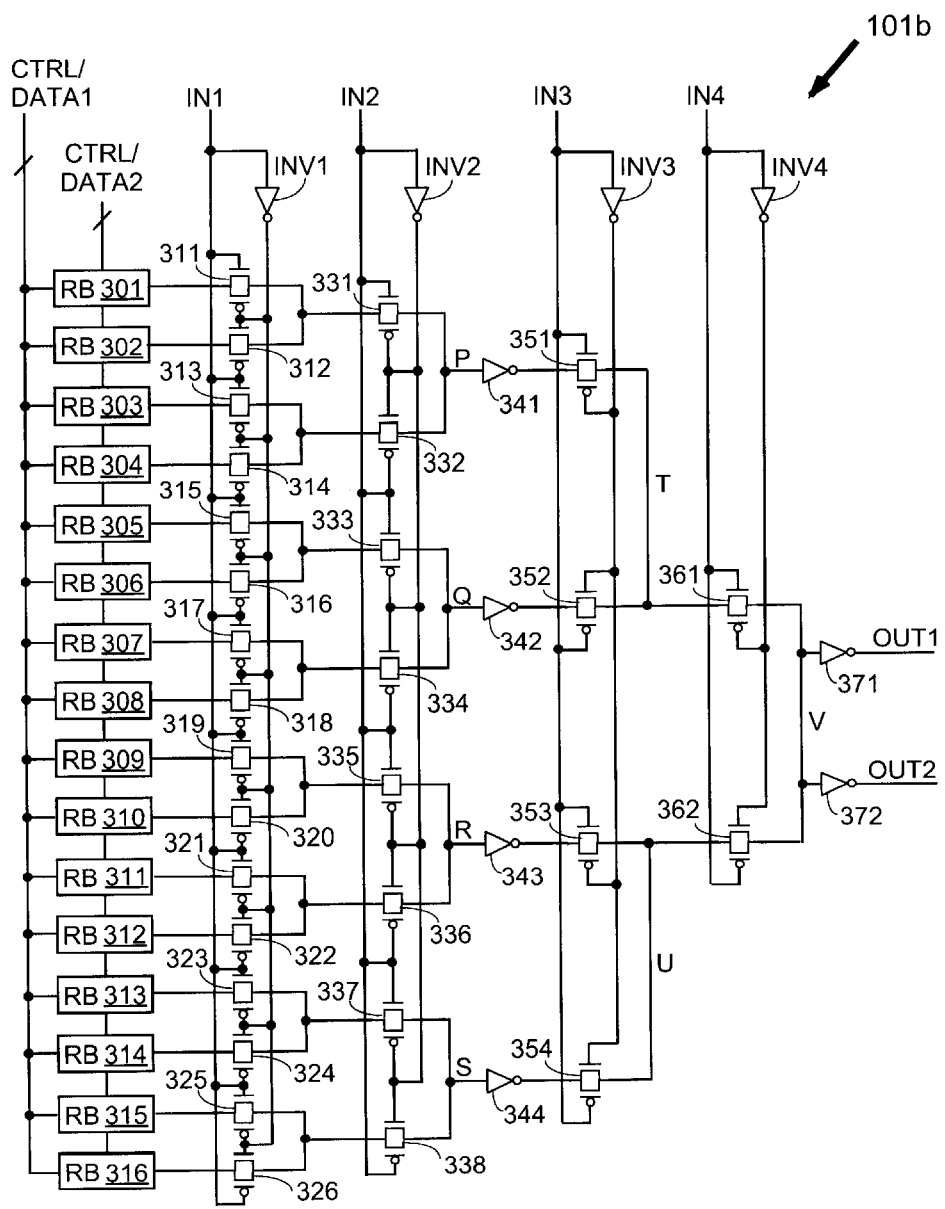
FIG. 3 shows a first lookup table that can be used with the CLB of FIG. 1, designed for use at a low operating voltage according to a first embodiment of the present invention.

FIG. 3 shows a first low-voltage LUT according to one embodiment of the invention. LUT 101$b$ can be used, for example, in the CLB of FIG. 1. LUT 101$b$ includes 16 memory cells RB301–316, 30 CMOS pass gates 311–326, 331–338, 351–354, and 361–362, and 10 inverters 341–344, 371–372, and INV1–INV4.

Each memory cell RB301–RB316 provides one output signal, of which one must be selected. The memory cells can be the same, for example, as memory cells RB201–RB216 of FIG. 2. The 16 memory cell output signals are reduced to four, first by eliminating half of the signals using input signal IN1, then by eliminating another half of the signals using input signal IN2. The portion of the circuit that performs these tasks is similar to that of LUT 101$a$ of FIG. 2, except that the N-channel transistors used as pass gates in LUT 101$a$ have been replaced by CMOS pass gates. The N-terminal of each CMOS pass gate is coupled to the same signal as the gate terminal of the corresponding N-channel transistor in LUT 101$a$. The P-terminal of each CMOS pass gate is coupled to the inverse of that signal.

Figure 2:
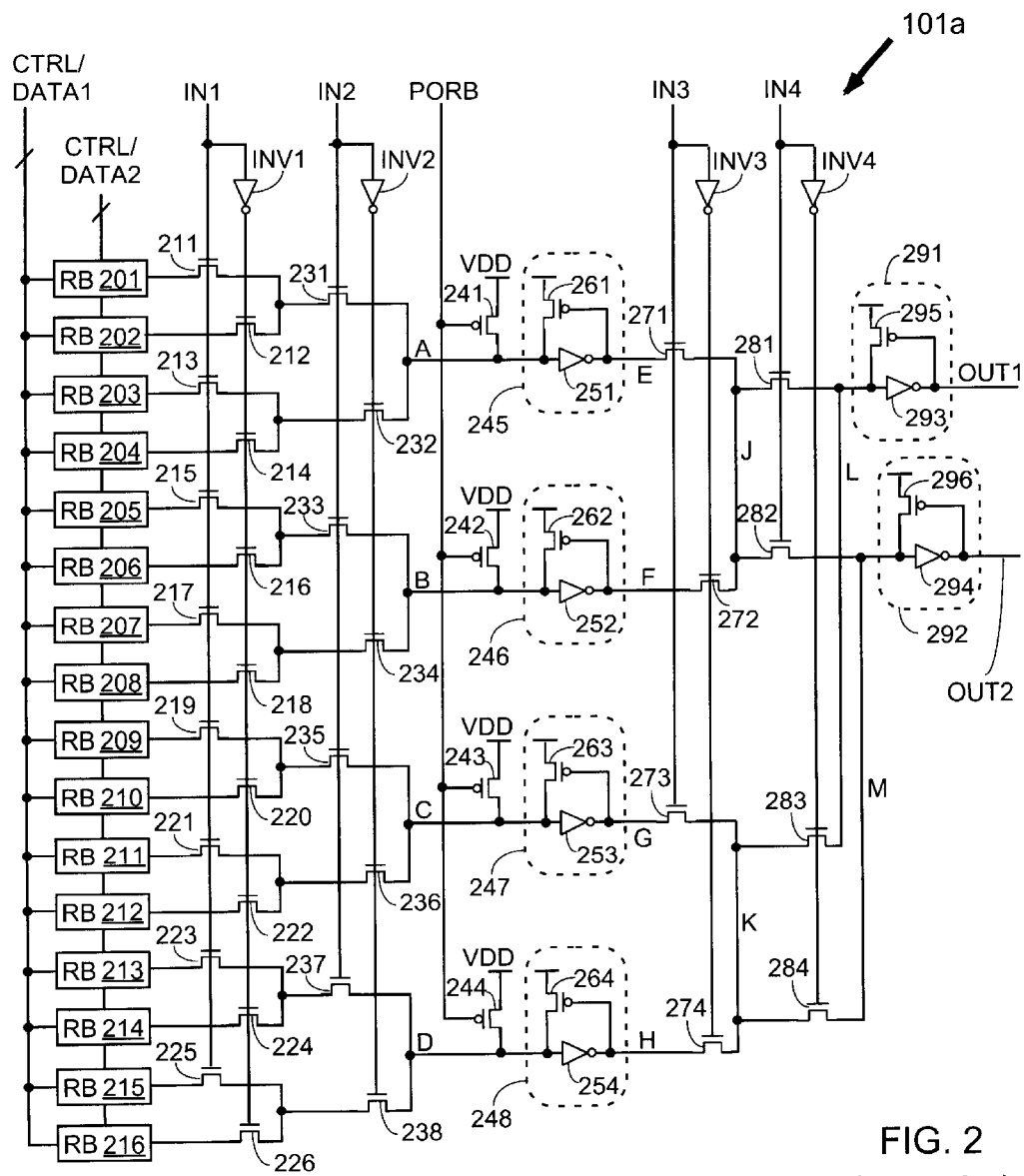
FIG. 2 shows a lookup table (LUT) from the Virtex-II CLB of FIG. 1.

Therefore, the signal on node P in FIG. 3 is similar to the signal on node A in FIG. 2, but with an important difference. When a high value is passed to node A, the signal is attenuated by having passed through one or more N-channel transistors. In other words, when the selected memory cell output signal is at power high (VDD), the high signal at node A has a voltage level of VDD−Vth, or VDD minus the threshold voltage level of an N-channel transistor. On the other hand, the voltage level at node P is still at voltage level VDD.

This difference has several significant implications. First, LUT 101$b$ can operate at a lower VDD level than LUT 101$a$. Second, half-latches were necessary, at nodes A–D in FIG. 2 to ensure a true "high" value on the node. These half-latches are not necessary at nodes P–S in FIG. 3, because a high value on the nodes is already at a VDD voltage level. Third, pull-ups 241–244 were included in LUT 101$a$ to ensure a high value on nodes A–D (and subsequently on the LUT output terminals OUT1–OUT2) after a power-on or reset sequence. These pull-ups are not necessary in the embodiment of FIG. 3. The reason is that after a power-on or reset sequence, the output signal from each memory cell is high. No matter which memory cell is selected, the value at each of nodes P–S is high, and, because of the CMOS pass gates, that value is at a VDD voltage level.

Because half-latches are not needed in LUT 101$b$, each of nodes P–S drives an inverter (341–344, respectively), and the output of each inverter passes through another CMOS pass gate (351–354, respectively). The inverted value from node P passes through CMOS pass gate 351 whenever signal IN3 is high, while the inverted value from node Q passes through CMOS pass gate 352 whenever signal IN3 is low (i.e., the output of inverter INV3 is high). The selected one of these two output signals passes through CMOS pass gate 361 to node V whenever signal IN4 is high.

Similarly, the inverted value from node R passes through CMOS pass gate 353 whenever signal IN3 is high, while the inverted value from node S passes through CMOS pass gate 354 whenever signal IN3 is low (i.e., the output of inverter INV3 is high). The selected one of these two output signals passes through CMOS pass gate 362 to node V whenever signal IN4 is low.

Two inverters 371–372 are provided to generate the two LUT output signals OUT1–OUT2 from the signal on node V. In other embodiments, only one output signal is provided.

Note that no half-latches are required on any of the nodes in LUT 101$b$ to ensure reliable values on the output terminals OUT1 and OUT2.

By replacing the N-channel transistors of FIG. 2 with CMOS pass gates, a LUT is provided in FIG. 3 that has the advantage of operating correctly at a relatively low voltage level. However, clearly many more transistors are required than in the implementation of FIG. 2. Aside from the 16 memory cells, the known implementation of FIG. 2 uses 62 transistors to implement a 4-input LUT, most of them, N-channel transistors (which, as noted above, are smaller than P-channel transistors designed to operate under the same conditions). To perform the same function, the novel implementation of FIG. 3 includes 80 transistors, half of them P-channel transistors. The disadvantages of this increased transistor count are obvious. However, the advantage of low-voltage operation is sufficient to make the implementation of FIG. 3 advantageous for many applications.

Figure 4:
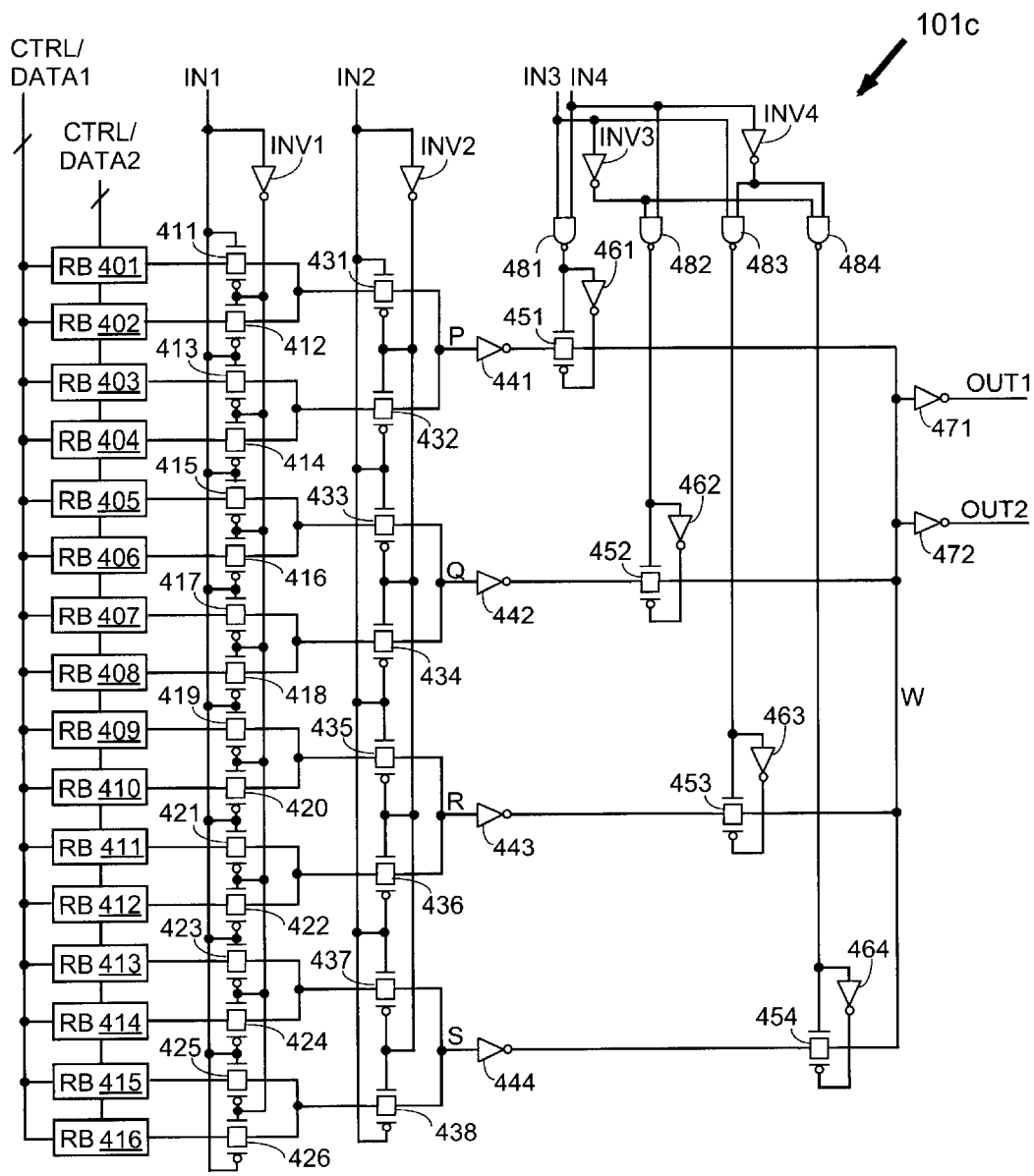
FIG. 4 shows a second lookup table that can be used with the CLB of FIG. 1, designed for use at a low operating voltage according to a second embodiment of the present invention.

FIG. 4 shows another embodiment, this embodiment using 100 transistors (and 16 memory cells) to implement a 4-input LUT. Again, half of these transistors are P-channel transistors. However, LUT 101c of FIG. 4 has further advantages in addition to supporting low-voltage operation. The embodiment of FIG. 4 is similar to that of FIG. 3, except that two of the input signals (IN3 and IN4) are decoded before being used to select among the memory cell output signals.

The leftmost portion of LUT 101c is the same as that of LUT 101b of FIG. 3. In other words, the circuits from the memory cells through nodes P–S are the same in FIGS. 3 and 4. Also, each of nodes P–S drives an inverter (441–444, respectively, in LUT 101c), which in turn provides a signal to a CMOS pass gate (451–454, respectively, in LUT 101c). However, CMOS pass gates 451–454 are controlled by a decoder circuit comprising NAND gates 481–484 and inverters INV3–INV4. Input signals IN3 and IN4 are decoded by the decoder circuit, such that only one of NAND gates 481–484 provides a high value at any given time. The NAND gate providing the high value selects one of nodes P–S to provide an inverted value to node W.

Two inverters 471–472 are provided to generate the two LUT output signals OUT1–OUT2 from the signal on node W. In other embodiments, only one output signal is provided.

Those having skill in the relevant arts of the invention will now perceive various modifications and additions that can be made as a result of the disclosure herein. For example, memory cells, registers, transistors, N-channel transistors, P-channel transistors, CMOS pass gates, inverters, NAND gates, FPGAs, CLBs, multiplexers, decoder circuits, decoders, and other components other than those described herein can be used to implement the invention. Active-high signals can be replaced with active-low signals by making straightforward alterations to the circuitry, such as are well known in the art of circuit design.

Moreover, some components are shown directly connected to one another while others are shown connected via intermediate components. In each instance the method of interconnection establishes some desired electrical communication between two or more circuit nodes. Such communication may often be accomplished using a number of circuit configurations, as will be understood by those of skill in the art.

Accordingly, all such modifications and additions are deemed to be within the scope of the invention, which is to be limited only by the appended claims and their equivalents.

What is claimed is:

1. A lookup table (LUT) in a low-voltage field programmable gate array (FPGA) configurable with a configuration bitstream, comprising:
    N LUT input terminals, where N is an integer;
    N inverters, each having an input terminal coupled to an associated one of the LUT input terminals and further having an output terminal;
    a LUT output terminal;
    a plurality of memory cells storing values from the configuration bitstream, each memory cell having an output terminal; and
    a plurality of CMOS pass gates coupled between the output terminal of each memory cell and the LUT output terminal, wherein a path between each memory cell and the LUT output terminal traverses N of the CMOS pass gates, each CMOS pass gate on a given path having a first gate terminal coupled to a different one of the LUT input terminals and a second gate terminal coupled to the output terminal of the associated inverter.

2. The lookup table of claim 1, wherein for each CMOS pass gate the first gate terminal is an N-terminal and the second gate terminal is a P-terminal.

3. The lookup table of claim 1, wherein N is four.

4. The lookup table of claim 3, wherein the plurality of memory cells comprises 16 memory cells.

5. The lookup table of claim 1, the plurality of CMOS pass gates including an additional CMOS pass gate on the path between each memory cell and the LUT output terminal, the lookup table further comprising:
    M additional LUT input terminals, where M is an integer; and
    a decoder circuit having input terminals coupled to the M additional LUT input terminals and output terminals coupled to the gate terminals of the additional CMOS pass gates.

6. The lookup table of claim 5, wherein N is two and M is two.

7. The lookup table of claim 6, wherein the plurality of memory cells comprises 16 memory cells.

8. The lookup table of claim 5, wherein the decoder circuit comprises:
    M inverters having input terminals coupled to the M additional LUT input terminals and further having output terminals; and
    a plurality of NAND gates having input terminals coupled to the M additional LUT input terminals and to the output terminals of the M inverters and further having output terminals coupled to the gate terminals of the additional CMOS pass gates.

9. The lookup table of claim 1, further comprising a first inverter having an input terminal coupled to the LUT output terminal.

10. The lookup table of claim 9, further comprising a second inverter having an input terminal coupled to the LUT output terminal.

11. A configurable logic block (CLB) in a field programmable gate array (FPGA) designed to operate in a low-voltage environment, the CLB comprising:
    N function generator input terminals, where N is an integer;
    a function generator output terminal;
    a registered output terminal;
    a lookup table (LUT) comprising N LUT input terminals coupled to the N function generator input terminals and a LUT output terminal coupled to the function generator output terminal; and
    a register comprising a data input terminal programmably coupled to the output terminal of the LUT and a data output terminal coupled to the registered output terminal,
    wherein the lookup table further comprises:
        N inverters, each having an input terminal coupled to an associated one of the N LUT input terminals and further having an output terminal;
        a plurality of memory cells, each memory cell having an output terminal; and
        a plurality of CMOS pass gates coupled between the output terminal of each memory cell and the LUT output terminal, wherein a path between each memory cell and the LUT output terminal traverses N of the CMOS pass gates, each CMOS pass gate on a given path having a first gate terminal coupled to a different one of the LUT input terminals and a second gate terminal coupled to the output terminal of the associated inverter.

12. The CLB of claim 11, wherein for each CMOS pass gate the first gate terminal is an N-terminal and the second gate terminal is a P-terminal.

13. The CLB of claim 11, wherein N is four.

14. The CLB of claim 13, wherein the plurality of memory cells comprises 16 memory cells.

15. The CLB of claim 11, the plurality of CMOS pass gates including an additional CMOS pass gate on the path between each memory cell and the LUT output terminal, the lookup table further comprising:
   M additional LUT input terminals, where M is an integer; and
   a decoder circuit having input terminals coupled to the M additional LUT input terminals and output terminals coupled to the gate terminals of the additional CMOS pass gates.

16. The CLB of claim 15, wherein N is two and M is two.

17. The CLB of claim 16, wherein the plurality of memory cells comprises 16 memory cells.

18. The CLB of claim 15, wherein the decoder circuit comprises:
   M inverters having input terminals coupled to the M additional LUT input terminals and further having output terminals; and
   a plurality of NAND gates having input terminals coupled to the M additional LUT input terminals and to the output terminals of the M inverters and further having output terminals coupled to the gate terminals of the additional CMOS pass gates.

19. The CLB of claim 11, wherein the lookup table further comprises a first inverter having an input terminal coupled to the LUT output terminal and an output terminal coupled to the function generator output terminal of the CLB.

20. The CLB of claim 19, wherein:
   the CLB further comprises a carry logic circuit; and
   the LUT further comprises a second inverter having an input terminal coupled to the LUT output terminal and an output terminal coupled to the carry logic circuit.

* * * * *